US009519391B2

(12) United States Patent
Peterson et al.

(10) Patent No.: US 9,519,391 B2
(45) Date of Patent: Dec. 13, 2016

(54) CAPACITIVE SENSOR ARRAY WITH PATTERN VARIATION

(71) Applicant: MONTEREY RESEARCH, LLC, Santa Clara, CA (US)

(72) Inventors: Jonathan R Peterson, Everett, WA (US); Cole D. Wilson, Everett, WA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 44 days.

(21) Appl. No.: 14/663,855

(22) Filed: Mar. 20, 2015

(65) Prior Publication Data

US 2015/0286316 A1 Oct. 8, 2015

Related U.S. Application Data

(63) Continuation of application No. 13/338,665, filed on Dec. 28, 2011, now Pat. No. 8,988,086.

(60) Provisional application No. 61/521,864, filed on Aug. 10, 2011.

(51) Int. Cl.
*G06F 3/044* (2006.01)
*G06F 3/041* (2006.01)

(52) U.S. Cl.
CPC .......... *G06F 3/044* (2013.01); *G06F 3/0416* (2013.01); *G06F 2203/04103* (2013.01); *G06F 2203/04107* (2013.01); *H03K 2217/960775* (2013.01)

(58) Field of Classification Search
CPC .......... G06F 2203/04103; G06F 2203/04107; G06F 3/0416; G06F 3/044; H03K 2217/960775

USPC .............................. 345/173, 174; 178/18.06
See application file for complete search history.

(56) References Cited

U.S. PATENT DOCUMENTS

| 5,045,644 | A | 9/1991 | Dunthorn |
| 5,952,998 | A | 9/1999 | Clancy et al. |
| 6,459,424 | B1 | 10/2002 | Resman |
| 7,196,281 | B2 | 3/2007 | Cok et al. |
| 7,683,891 | B2 | 3/2010 | Tran |
| 2003/0132920 | A1 | 7/2003 | Lee et al. |
| 2005/0184965 | A1 | 8/2005 | Geaghan et al. |
| 2007/0222766 | A1 | 9/2007 | Bolender |
| 2007/0229470 | A1* | 10/2007 | Snyder .................... G06F 3/011 345/173 |
| 2009/0021267 | A1 | 1/2009 | Golovchenko et al. |
| 2009/0213082 | A1 | 8/2009 | Ku |

(Continued)

OTHER PUBLICATIONS

USPTO Final Rejection for U.S. Appl. No. 13/338,665 dated Aug. 18, 2014; 10 pages.

(Continued)

*Primary Examiner* — Dmitriy Bolotin
(74) *Attorney, Agent, or Firm* — Kunzler Law Group, PC

(57) ABSTRACT

Embodiments described herein provide capacitive sensor arrays. The capacitive sensor arrays include a plurality of column sensor elements arranged in a plurality of columns and a plurality of row sensor elements arranged in a plurality of rows. The plurality of rows and the plurality of columns are arranged such that each of the row sensor elements is at least partially within a gap between adjacent ones of the column sensor elements. A capacitance between a first portion of one of the columns and an adjacent first portion of one of the rows is greater than a capacitance between a second portion of one of the columns and an adjacent second portion of one of the rows.

21 Claims, 7 Drawing Sheets

(56) References Cited

U.S. PATENT DOCUMENTS

| | | | |
|---|---|---|---|
| 2010/0045614 A1 | 2/2010 | Gray et al. | |
| 2010/0060596 A1 | 3/2010 | Whight | |
| 2010/0079393 A1 | 4/2010 | Dews | |
| 2010/0201633 A1 | 8/2010 | Mozdzyn et al. | |
| 2010/0214247 A1 | 8/2010 | Tang et al. | |
| 2010/0295814 A1 | 11/2010 | Kent et al. | |
| 2010/0302201 A1 | 12/2010 | Ritter et al. | |
| 2011/0007020 A1 | 1/2011 | Hong et al. | |
| 2011/0018829 A1 | 1/2011 | Peng | |
| 2011/0080353 A1 | 4/2011 | Kang et al. | |
| 2011/0095996 A1 | 4/2011 | Yilmaz | |
| 2011/0109572 A1 | 5/2011 | Deslippe et al. | |
| 2011/0157079 A1 | 6/2011 | Wu et al. | |
| 2011/0187677 A1* | 8/2011 | Hotelling | G06F 3/0412 345/174 |
| 2011/0227858 A1 | 9/2011 | An et al. | |
| 2011/0316567 A1* | 12/2011 | Chai | G06F 3/044 324/686 |
| 2012/0019268 A1 | 1/2012 | Tao et al. | |
| 2012/0050214 A1 | 3/2012 | Kremin et al. | |
| 2012/0056664 A1 | 3/2012 | Nam | |
| 2012/0127118 A1 | 5/2012 | Nolting et al. | |
| 2012/0133611 A1 | 5/2012 | Chai et al. | |
| 2012/0212449 A1 | 8/2012 | Kuriki | |
| 2013/0207911 A1 | 8/2013 | Barton et al. | |
| 2013/0221991 A1 | 8/2013 | Campbell | |
| 2013/0285975 A1 | 10/2013 | Hong et al. | |
| 2014/0022202 A1 | 1/2014 | Badaye et al. | |
| 2014/0313159 A1* | 10/2014 | Wilson | G06F 3/044 345/174 |

OTHER PUBLICATIONS

USPTO Non-Final Rejection for U.S. Appl. No. 13/338,665 dated Apr. 17, 2014; 9 pages.

USPTO Notice of Allowance for U.S. Appl. No. 13/338,665 dated Jan. 22, 2015; 5 pages.

USPTO Notice of Allowance for U.S. Appl. No. 13/338,665 dated Oct. 29, 2014; 7 pages.

\* cited by examiner

CAPACITIVE SENSOR ARRAY WITH PATTERN VARIATION

RELATED APPLICATION

This application is a Continuation of U.S. patent application Ser. No. 13/338,665, filed on Dec. 28, 2011, and claims the priority benefits of U.S. Provisional Patent Application No. 61/521,864, filed Aug. 10, 2011, which is incorporated in its entirety by reference herein.

TECHNICAL FIELD

This disclosure relates to the field of capacitive sensors, in particular, capacitive sensors having sensor arrays with pattern variation.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products. Capacitive touch sensors can be arranged in the form of a sensor array for a touch-sensing surface. When a conductive object, such as a finger, comes in contact or close proximity with the touch-sensing surface, the capacitance of one or more capacitive touch sensors changes. The capacitance changes of the capacitive touch sensors can be measured by an electrical circuit. The electrical circuit converts the measured capacitances of the capacitive touch sensors into digital values.

Current touch sensor patterns are typically uniform across the screen. That is, a "unit cell" is designed and replicated across the panel. One disadvantage of such systems is that specific applications may require increased or decreased sensitivities in a given area on the touch sensor which existing technologies do not provide for. For example, general touch sensor interfaces may benefit from an increased sensitivity at the screen border to correct for accuracy issues observed along the edges. Other applications may be made up of predominantly button-based interfaces and may attempt to concentrate sensitivity over the button locations without sacrificing the capability of using the touch sensor for more general uses as well.

Another example is seen with general touch sensor devices which have large screens. As the screen size grows, the portions of the panel which are farthest from the sensing circuitry typically become noticeably less sensitive than the portions of the panel which are close to the sensing circuitry. Current solutions de-tune the entire panel to match the performance of the worst-case position. Because conventional systems do not vary sensitivity to correct for any sensitivity issues across the panel, a negative user experience can be observed.

BRIEF DESCRIPTION OF THE DRAWINGS

The present disclosure is illustrated by way of example, and not by way of limitation, in the figures of the accompanying drawings.

DETAILED DESCRIPTION

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Embodiments described herein provide capacitive sensor arrays for touch sensor devices that include variations in the pattern of the sensor elements to achieve desired sensitivity in specific areas. The variations in the sensor element pattern may include changing the shapes of the sensor elements, increasing or decreasing the spacing between the sensor elements, and/or increasing or decreasing sensor element size.

Figure 1:
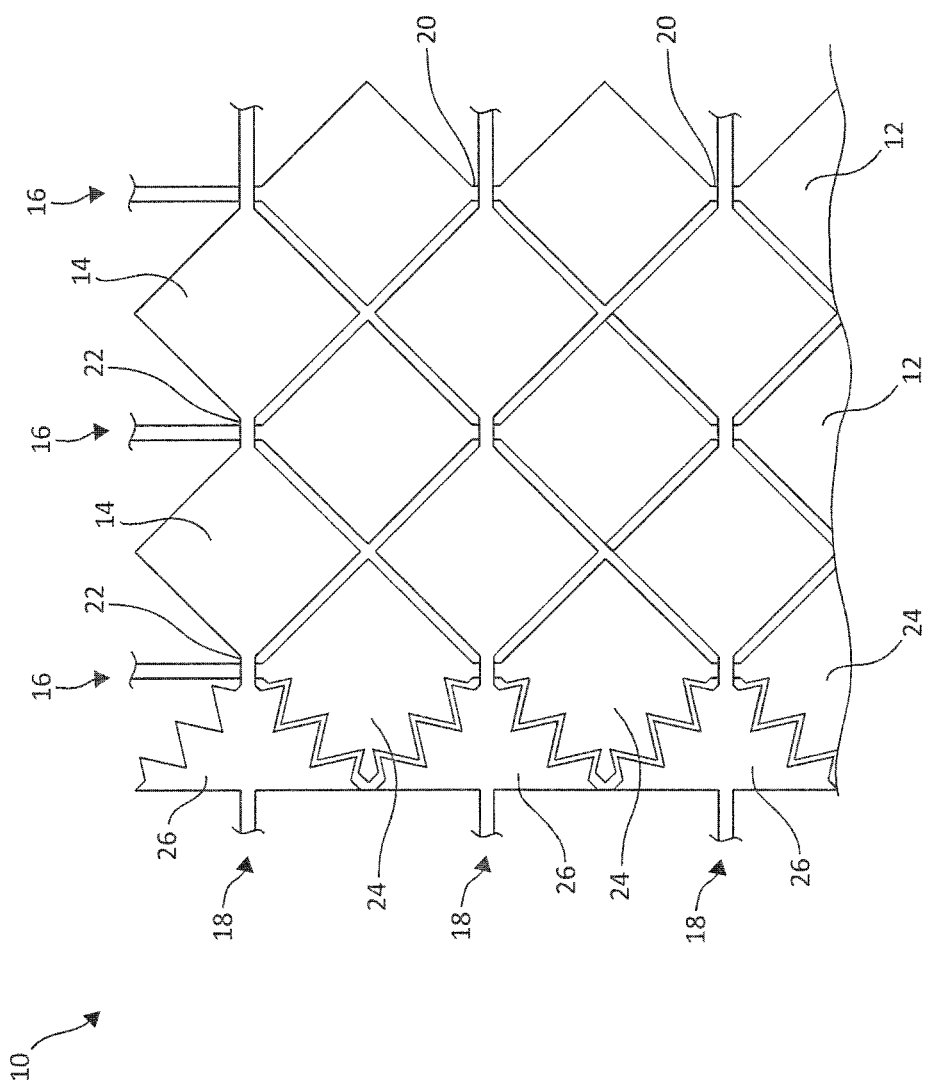
FIG. 1 is a plan view illustrating an embodiment of a capacitive sensor array.

FIG. 1 illustrates a capacitive sensor array 10 according to one embodiment of the present invention. The capacitive sensor array 10 includes a plurality of column sensor elements 12 and a plurality of row sensor elements 14. The column sensor elements 12 are arranged in multiple columns 16, and the row sensor elements 12 are arranged in multiple rows 18. As shown, the columns 16 and the rows 18 are arranged such that the column sensor elements 12 are positioned within spaces or gaps between the adjacent row sensor elements 14, and vice versa. Although not specifically shown, the column sensor elements 12 and the row sensor elements 14 are, in at least one embodiment, substantially coplanar and formed on a substrate, or between two substrates. When used in a mutual capacitance sensing device, the column sensor elements 12 may be used as transmit electrodes (TX), and the row sensor elements 14 may be used as receive electrodes (RX), as is commonly understood.

In an embodiment, the individual sensor elements 12 and 14, are configured as substantially diamond-shaped polygons of an optically transmissive conductive material. Any material known to be transmissive over at least a portion of the wavelength band emitted by the display to be paired with the sensor array 10 may be employed for the sensor elements. In one embodiment, individual sensor elements are formed of an optically transmissive conductive material, such as, but not limited to indium tin oxide (ITO), poly (3,4-ethylenedioxythiophene) poly (styrenesulfonate) (PEDOT-PSS), carbon nanotubes, conductive ink, graphite/graphene and the like.

The column sensor elements 12 are interconnected by column interconnects 20, which may be made of the same material as the sensor elements 12 and 14. The row sensor elements 14 are interconnected by row interconnects 22, which may includes "jumpers," as commonly understood, to extend over the column interconnects 20, between adjacent column sensor elements 12.

In accordance with one aspect of the present invention, variations in the pattern of the sensor elements 12 and 14 are formed in the sensor array 10 to tune the sensitivity of the sensor array 10, or more particularly, to increase the sensitivity of the sensor array 10 in selected regions. In the example shown in FIG. 1, unique column sensor elements 24 and row sensor elements 26 are shaped such that adjacent edges thereof have a "sawtooth" shape. The effect of such a shape of the adjacent edges it to increase the length of the adjacent edges of the sensor elements 24 and 26 (i.e., as compared to the length of the adjacent, straight edges of the other sensor elements 12 and 14).

As a result, the capacitance between the column sensor elements 24 and the adjacent row sensor elements 26 is increased (i.e., as compared to the capacitance between the other sensor elements 12 and 14). More particularly, the row-column capacitance, or the capacitance between the column sensor elements 24 and the adjacent row sensor elements 26 when a conductive object (e.g., a finger) is not present, is increased. Thus, when the sensor array 10 is used in a mutual capacitance sensing device, the presence of a conductive object may be more readily detected in the region of the sensor array 10 that includes the unique sensor elements 24 and 26, which in the depicted embodiment, is along an edge of the array 10.

Figure 2:
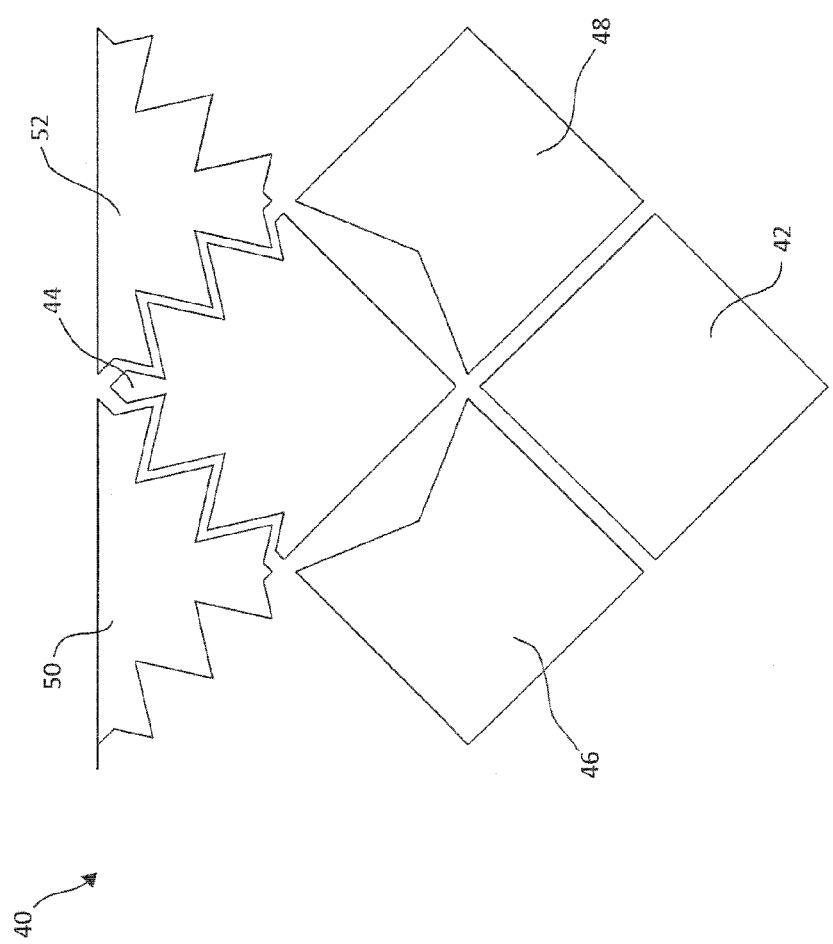
FIG. 2 is a plan view illustrating an embodiment of a capacitive sensor array.

FIG. 2 illustrates a portion of a capacitive sensor array 40 according to another embodiment of the present invention. The capacitive sensor array 40 includes column sensor elements (e.g., TX electrodes) 42 and 44 and row sensor elements (e.g., RX electrodes) 46, 48, 50, and 52. As shown, column sensor element 42 has substantially straight edges. However, the edges of column sensor element 44 and row sensor elements 46, 48, 50, and 52 are patterned to turn the sensitivity of the array 40 in those particular regions.

For example, the adjacent edges of column sensor element 44 and row sensor elements 50 and 52 are shaped in the "sawtooth" manner as described above to increase the capacitance between column sensor element 44 and both row sensor element 50 and row sensor element 52 (i.e., as compared to the capacitance between column sensor element 42 and row sensor elements 46 and 48, which have adjacent edges that are straight). However, the edges of row sensor elements 46 and 48 which are adjacent to column sensor element 44 have a substantially concave shape. The effect of the concave shape is that the overall distance between row sensor elements 46 and 48 and column sensor element 44 is increased. As a result, the capacitance between row sensor elements 46 and 48 and column sensor element 44 is decreased.

Thus, when the array 40 is used in a mutual capacitance sensing device, the regions on the array 40 near or between column sensor element 44 and row sensor elements 50 and 52 are particularly sensitive, especially when compared to the regions near or between column sensor element 44 and row sensor elements 46 and 48.

The embodiment shown in FIG. 2 may be particularly useful for fixed, capacitive buttons applications. One such application may also implement gestures, for example, which requires a full touch panel and not a fixed button implementation. One such example is a thermostat on which the interface is composed primarily of fixed buttons and a two-finger pan gesture could be used to increase or decrease the temperature. Conventional array designs would provide equal weighting across the screen and would not emphasize the areas where buttons would be placed on a user interface. The effect of the using arrays like that shown in FIG. 2 touch positions will naturally "snap" to the areas where buttons are placed (e.g., the more sensitive regions). By maintaining, for example, a conventional pattern across the remainder of the device, other touch functions (such as gestures) may still be implemented.

Figure 3:
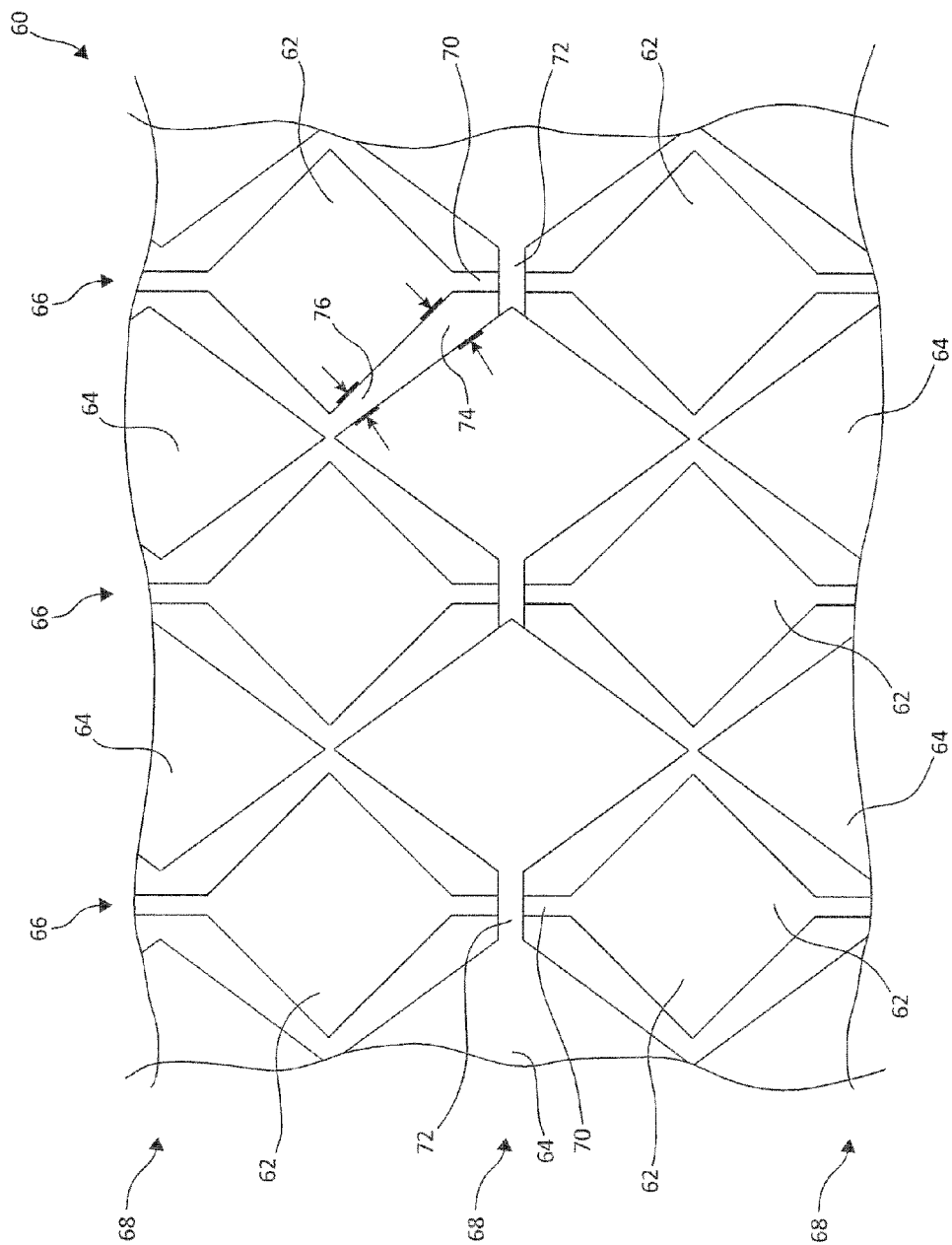
FIG. 3 is a plan view illustrating an embodiment of a capacitive sensor array.

FIG. 3 illustrates a capacitive sensor array 60 according to another embodiment of the present invention. The capacitive sensor array 60 includes a plurality of column sensor elements 62 and a plurality of row sensor elements 64. The column sensor elements 62 are arranged in multiple columns 66, and the row sensor elements 64 are arranged in multiple rows 68, similar to the embodiment shown in FIG. 1.

The column sensor elements 62 are interconnected by column interconnects 70, which may be made of the same material as the sensor elements 62 and 64. The row sensor elements 64 are interconnected by row interconnects 72 to extend over the column interconnects 70, between adjacent column sensor elements 62.

In accordance with one aspect of the present invention, the sensor elements 62 and 64 are sized and shaped compensate for increased sensitivity in particular regions of the array, which may occur in conventional arrays. In particular, the sensor elements 62 and 64 are configured in a way to decrease extra sensitivity which may occur at the intersections of the column interconnects 70 and the row interconnects 72.

As specifically shown in FIG. 3, the sensor elements 62 and 64 are sized and shape in a way to increase the distance between adjacent sensor elements near the intersections of the column interconnects 70 and the row interconnects 72. For example, distance 74 between adjacent edges of a column sensor element 62 and a row sensor element 64, near one of the intersections, is greater than distance 76 between the same adjacent edges, at a point farthest from any of the intersections. As shown, this spatial relationship is repeated for all of the sensor elements 62 and 64 shown in FIG. 3.

As a result, the capacitance between adjacent sensor elements 62 and 64 (or adjacent edges of the sensor elements 62 and 64) is reduced for the regions of the array 60 near the intersections of the column interconnects 70 and the row interconnects 72. Stated differently, the relative capacitance between adjacent sensor elements 62 and 64 for regions of the array 60 farthest from (or between) the intersections is increased. Thus, when the array 60 is used in a mutual capacitance sensing device, the uniformity of the sensitivity of the array 60 is improved.

Figure 4:
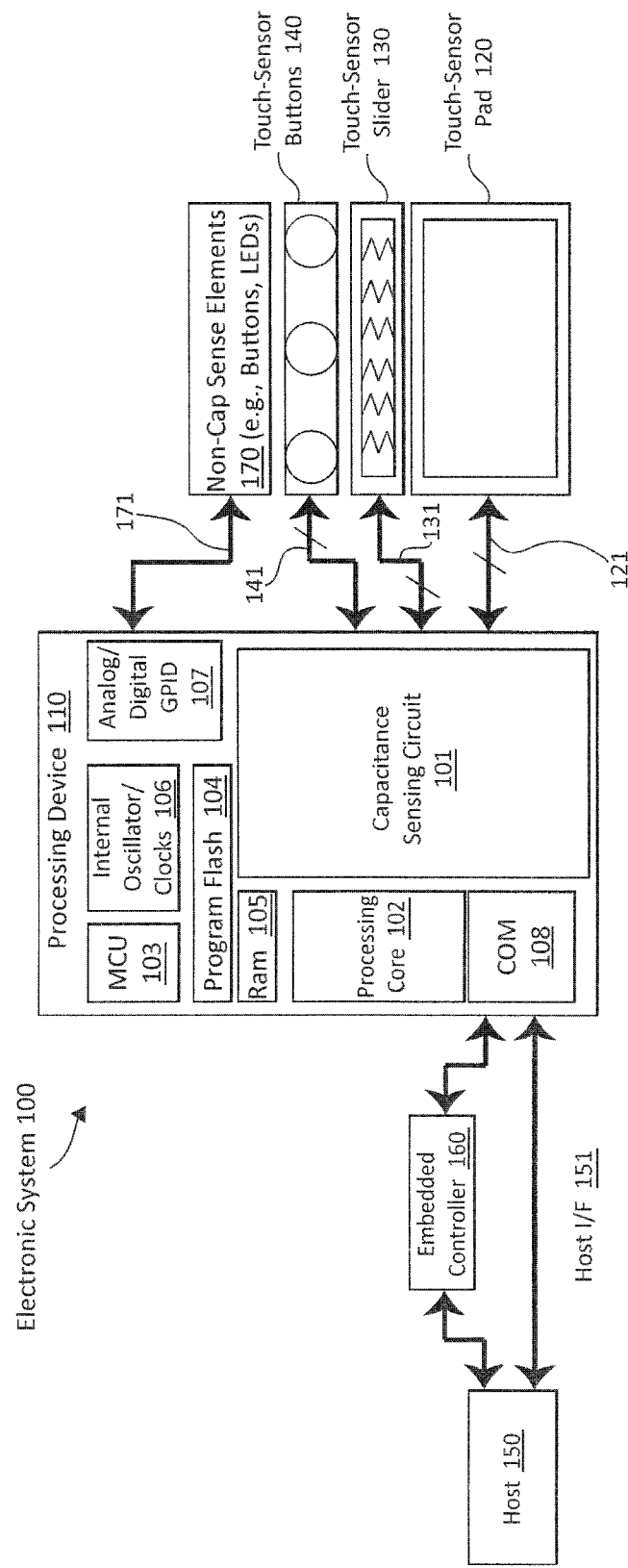
FIG. 4 is a block diagram of an embodiment of an electronic system having a processing device for detecting a presence of a conductive object.

FIG. 4 illustrates a block diagram of one embodiment of an electronic system having a processing device for detecting a presence of a conductive object according to an embodiment of the present invention. The electronic system 100 includes a processing device 110, a touch-sensor pad 120, a touch-sensor slider 130, touch-sensor buttons 140, a host processor 150, an embedded controller 160, and non-capacitance sensor elements 170. The processing device 110 may include analog and/or digital general purpose input/output ("GPIO") ports 107. The GPIO ports 107 may be programmable and may be coupled to a Programmable Interconnect and Logic ("PIL"), which acts as an interconnect between the GPIO ports 107 and a digital block array of the processing device 110. The digital block array may be configured to implement a variety of digital logic circuits (e.g., DACs, digital filters, or digital control systems) using, in one embodiment, configurable user modules ("UMs"). The digital block array may be coupled to a system bus. The processing device 110 may also include memory, such as random access memory ("RAM") 105 and program flash 104. The RAM 105 may be static RAM ("SRAM"), and the program flash 104 may be a non-volatile storage, which may be used to store firmware (e.g., control algorithms executable by processing core 102 to implement operations described herein). The processing device 110 may also include a memory controller unit ("MCU") 103 coupled to memory and the processing core 102.

The processing device 110 may also include an analog block array. The analog block array is also coupled to the system bus. The analog block array also may be configured to implement a variety of analog circuits (e.g., ADCs or analog filters) using, in one embodiment, configurable UMs. The analog block array may also be coupled to the GPIO 107.

As illustrated, the capacitance sensing circuit 101 may be integrated into the processing device 110. The capacitance sensing circuit 101 may include analog I/O for coupling to an external component, such as the touch-sensor pad 120, the touch-sensor slider 130, the touch-sensor buttons 140, and/or other devices. The capacitance sensing circuit 101 and the processing device 110 are described in more detail below.

The embodiments described herein are not limited to touch-sensor pads for notebook implementations, but can be used in other capacitive sensing implementations, for example, the sensing device may be a touch screen, a touch-sensor slider 130, or touch-sensor buttons 140 (e.g., capacitance sensing buttons). In one embodiment, these sensing devices may include one or more capacitive sensors. The operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multimedia control (ex. volume, track advance, etc) handwriting recognition and numeric keypad operation.

In one embodiment, the electronic system 100 includes a touch-sensor pad 120 coupled to the processing device 110 via bus 121. The touch-sensor pad 120 may include a multi-dimension sensor array. The multi-dimension sensor array includes multiple sensor elements, organized as rows and columns, such as the sensor arrays described above and shown in FIGS. 1, 2, and 3. In another embodiment, the electronic system 100 includes a touch-sensor slider 130 coupled to the processing device 110 via bus 131. The touch-sensor slider 130 may include a single-dimension sensor array. The single-dimension sensor array includes multiple sensor elements, organized as rows, or alternatively, as columns. In another embodiment, the electronic system 100 includes touch-sensor buttons 140 (e.g., using the array 40 shown in FIG. 2) coupled to the processing device 110 via bus 141. The touch-sensor buttons 140 may include a single-dimension or multi-dimension sensor array. The single- or multi-dimension sensor array may include multiple sensor elements. For a touch-sensor button, the sensor elements may be coupled together to detect a presence of a conductive object over the entire surface of the sensing device. Alternatively, the touch-sensor buttons 140 may have a single sensor element to detect the presence of the conductive object. In one embodiment, the touch-sensor buttons 140 may include a capacitive sensor element. The capacitive sensor elements may be used as non-contact sensor elements. These sensor elements, when protected by an insulating layer, offer resistance to severe environments.

The electronic system 100 may include any combination of one or more of the touch-sensor pad 120, the touch-sensor slider 130, and/or the touch-sensor button 140. In another embodiment, the electronic system 100 may also include non-capacitance sensor elements 170 coupled to the processing device 110 via bus 171. The non-capacitance sensor elements 170 may include buttons, light emitting diodes ("LEDs"), and other user interface devices, such as a mouse, a keyboard, or other functional keys that do not require capacitance sensing. In one embodiment, buses 171, 141, 131, and 121 may be a single bus. Alternatively, these buses may be configured into any combination of one or more separate buses.

The processing device 110 may include internal oscillator/clocks 106 and a communication block ("COM") 108. The oscillator/clocks 106 provides clock signals to one or more of the components of the processing device 110. The communication block 108 may be used to communicate with an external component, such as a host processor 150, via host interface ("I/F") line 151. Alternatively, the processing block 110 may also be coupled to embedded controller 160 to communicate with the external components, such as host 150. In one embodiment, the processing device 110 is configured to communicate with the embedded controller 160 or the host 150 to send and/or receive data.

The processing device 110 may reside on a common carrier substrate such as, for example, an integrated circuit ("IC") die substrate, a multi-chip module substrate, or the like. Alternatively, the components of the processing device 110 may be one or more separate integrated circuits and/or discrete components. In one exemplary embodiment, the processing device 110 may be a Programmable System on a Chip ("PSoC™") processing device, manufactured by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 110 may also be done in the host.

The capacitance sensing circuit 101 may be integrated into the IC of the processing device 110, or alternatively, in a separate IC. Alternatively, descriptions of the capacitance sensing circuit 101 may be generated and compiled for incorporation into other integrated circuits. For example, behavioral level code describing the capacitance sensing circuit 101, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe the capacitance sensing circuit 101.

It should be noted that the components of the electronic system 100 may include all the components described above. Alternatively, the electronic system 100 may include only some of the components described above.

In one embodiment, the electronic system 100 may be used in a notebook computer. Alternatively, the electronic system 100 may be used in other applications, such as a mobile handset, a personal data assistant ("PDA"), a keyboard, a television, a remote control, a monitor, a handheld multi-media device, a handheld video player, a handheld gaming device, or a control panel.

Figure 5:
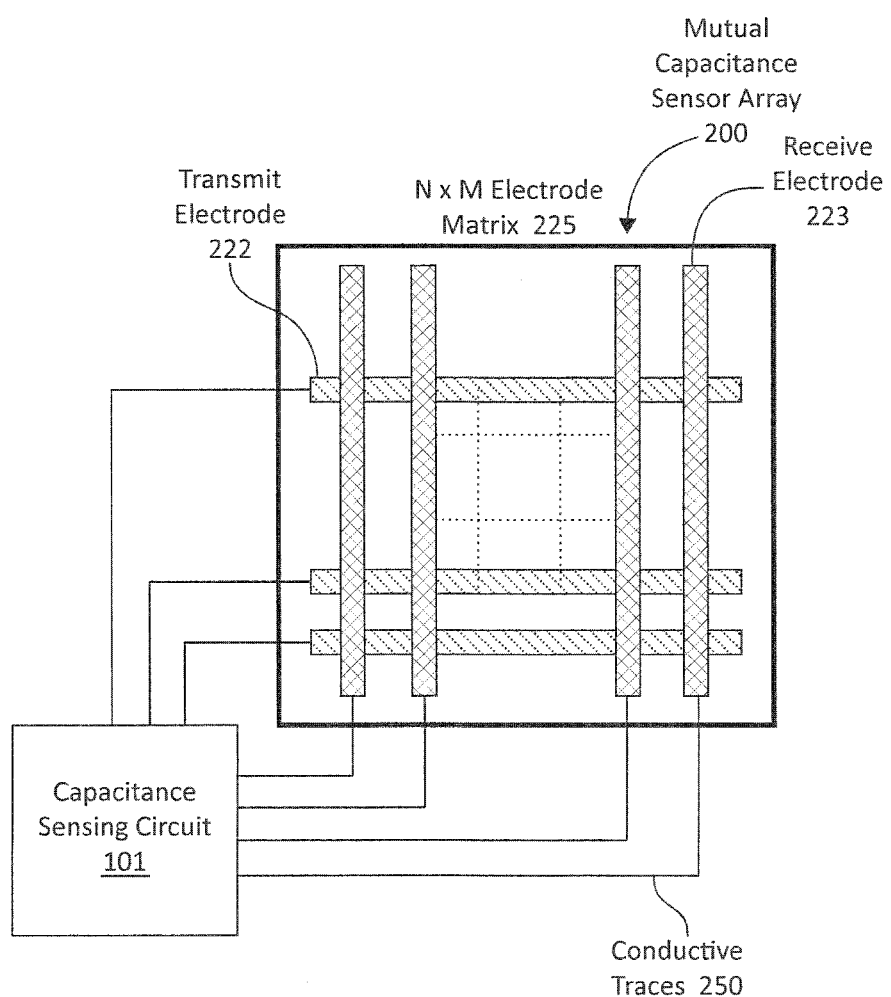
FIG. 5 is a block diagram illustrating one embodiment of a transmit-receive capacitive touchpad sensor and a capacitance sensing circuit that converts measured capacitances to touchpad coordinates.

FIG. 5 is a block diagram illustrating one embodiment of a mutual capacitance sensor array 200 comprising an N×M electrode matrix 225 and a capacitance sensing circuit 101 that converts measured capacitances to touchpad coordinates. The mutual capacitance sensor array 200 may be, for example, the touch sensor pad 120 of FIG. 4. The N×M electrode matrix 225 includes N×M electrodes (N receive electrodes and M transmit electrodes), which further includes transmit ("TX") electrode 222 and receive ("RX") electrode 223. Each of the electrodes in N×M electrode matrix 225 is connected with capacitance sensing circuit 101 by conductive traces 250. In one embodiment, capacitance sensing circuit 101 may operate using a charge accumulation technique as discussed further below in FIG. 6.

Although some embodiments described herein are described using a charge accumulation technique, the capacitance sensing circuit 101 may operate based on other techniques, such as a current versus voltage phase shift measurement, capacitive bridge divider, and charge-accumulation circuits.

The transmit and receive electrodes in the N×M electrode matrix 225 are arranged so that each of the transmit electrodes intersects each of the receive electrodes. Thus, each transmit electrode is capacitively coupled with each of the receive electrodes. For example, the transmit electrode 222 is capacitively coupled with the receive electrode 223 at the point where transmit electrode 222 and receive electrode 223 intersect.

Because of the capacitive coupling between the transmit and receive electrodes, a TX signal applied to each transmit electrode induces a current at each of the receive electrodes. For instance, when a TX signal is applied to transmit electrode 222, the TX signal induces an RX signal (not shown) on the receive electrode 223 in N×M electrode matrix 225. The RX signal on each of the receive electrodes can then be measured in sequence by using a multiplexer to connect each of the N receive electrodes to a demodulation circuit in sequence. The capacitance associated with each intersection between a TX electrode and an RX electrode can be sensed by selecting every available combination of TX electrode and RX electrode.

When an object, such as a finger, approaches the N×M electrode matrix 225, the object causes a decrease in capacitance affecting only some of the electrodes. For example, if a finger is placed near the intersection of the transmit electrode 222 and the receive electrode 223, the presence of the finger will decrease the capacitance between the two electrodes 222 and 223. Thus, the location of the finger on the touchpad can be determined by identifying both the receive electrode having a decreased capacitance and the transmit electrode to which the TX signal was applied at the time the decreased capacitance was measured on the receive electrode. Thus, by sequentially determining the capacitances associated with each intersection of electrodes in the N×M electrode matrix 225 the locations of one or more inputs can be determined. The conversion of the induced current waveform to touch coordinates indicating a position of an input on a touch sensor pad is known to those skilled in the art.

Figure 6:
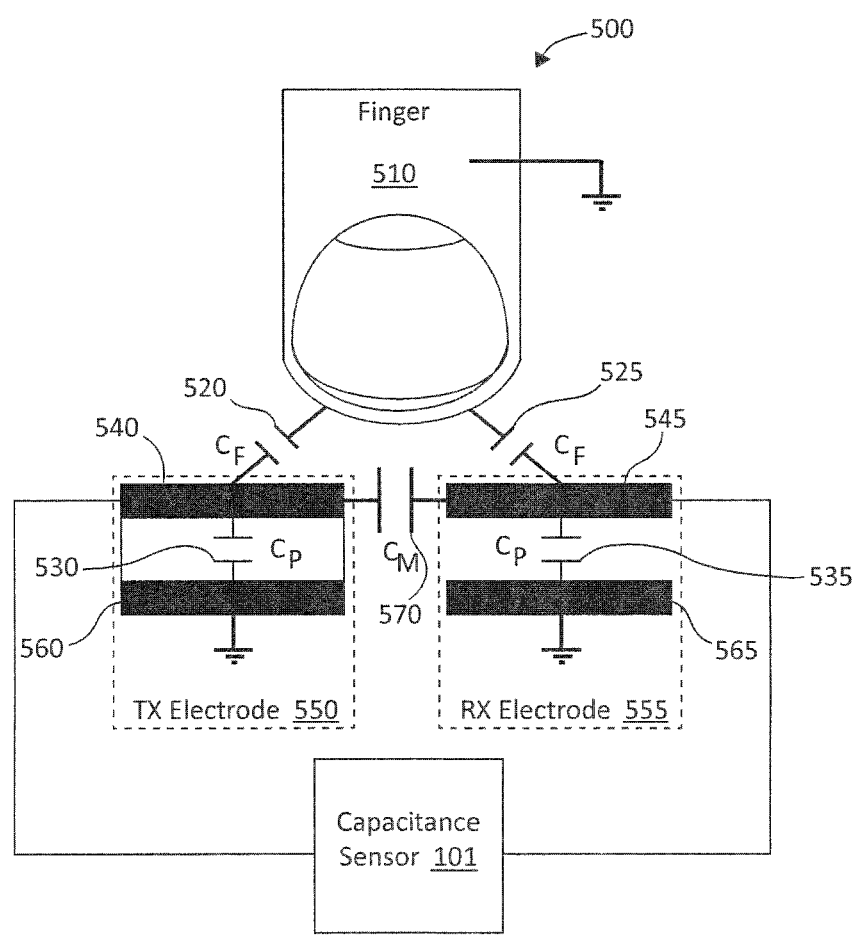
FIG. 6 illustrates the electrical characteristics of a pair of transmit-receive capacitive sensor elements according to an embodiment of the present invention.

FIG. 6 illustrates the electrical characteristics of a pair TX-RX capacitive sensor elements 500 ("TX-RX 500") according to an embodiment of the present invention. The TX-RX 500 includes a finger 510, a TX electrode 550, an RX electrode 555, and a capacitance sensor 101. The TX electrode 550 includes an upper conductive plate 540 ("UCP 540") and a lower conductive plate 560 ("LCP 560"). The RX electrode 555 includes an upper conductive plate 545 ("UCP 545") and a lower conductive plate 565 ("LCP 565").

The capacitance sensor 101 is electrically connected to the upper conductive plates 540 and 545 of TX electrode 550 and RX electrode 565, respectively. The upper conductive plates 540 and 545 are separated from the lower conductive plates 560 and 565, respectively, by air, dielectric, or any non-conductive material known to those skilled in the art. Similarly, the upper conductive plates 540 and 545 are separated from one another by air or dielectric material. The finger 510 and lower conductive plates 560 and 565 are electrically grounded.

Each of the transmit and receive electrodes 550 and 555, respectively, has a parasitic capacitance $C_P$ and a mutual capacitance $C_M$. The parasitic capacitance of a sensor element (TX/RX electrode) is the capacitance between the sensor element and ground. In the TX electrode 550, the parasitic capacitance is the capacitance between the UCP 540 and the LCP 560 as depicted by $C_P$ 530. In the RX electrode 555, the parasitic capacitance is the capacitance between the UCP 545 and the LCP 565 as depicted by $C_P$ 535. The mutual capacitance of the sensor element is the capacitance between the sensor element and other sensor elements. Here, the mutual capacitance is the capacitance between TX electrode 550 and RX electrode 555, denoted as $C_M$ 570.

The proximity of an object, such as a finger 510, near the electrodes 550 and 555 may change the capacitance between the electrodes as well as the capacitance between the electrodes and ground. The capacitance between the finger 510 and the electrodes is shown in FIG. 6 as $C_F$ 520 and $C_F$ 525. $C_F$ 520 is the capacitance between the UCP 540 and the finger 510. $C_F$ 525 is the capacitance between the UCP 545 and the finger 510. The magnitude of the change in capacitance induced by the finger 510 can be detected and converted to a voltage level or a digital code that can be processed by a computer or other circuit as described above. In one exemplary embodiment, $C_F$ may range from approximately 10-30 picofarads (pF). Alternatively, other ranges may occur.

The measured capacitance of the sensor elements as seen from capacitance sensor 101 includes the parasitic and mutual capacitances $C_P$ and $C_M$ in addition to $C_F$. The baseline capacitance may be described as the capacitance of the sensor element when no input (i.e., a finger touch) is present, or $C_P$ and $C_M$. The capacitance sensing circuit 101 and supporting circuitry must be configured to resolve a difference between the baseline capacitance and the capacitance including $C_F$ in order to accurately detect a legitimate presence of a conductive object.

Figure 7:
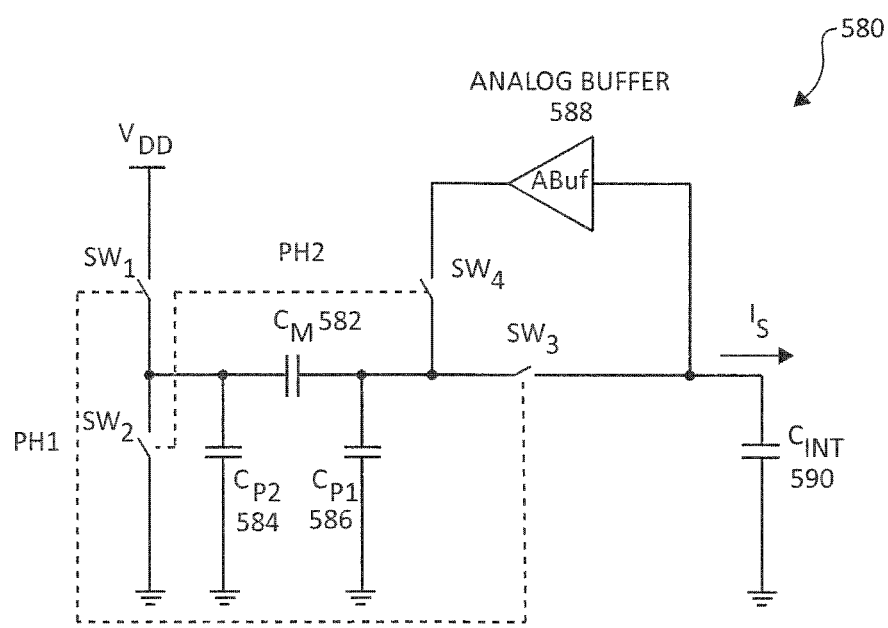
FIG. 7 illustrates a mutual capacitance sensing circuit for sensing the mutual capacitance of the capacitor in a mutual capacitance sensing mode according to an embodiment of the present invention.

FIG. 7 illustrates a mutual capacitance sensing circuit 580 for sensing the mutual capacitance of the capacitor $C_M$ 582 in a mutual capacitance (transmitter-receiver or TX-RX) sensing mode according to an embodiment of the present invention. The capacitance sensing circuit 580 is one embodiment of the capacitance sensing circuit 101 in FIGS. 4, 5, and 6. The capacitor $C_{P1}$ 584 and $C_{P2}$ 586 represent the parasitic capacitances of two sensor elements. The capacitance sensing circuit 580 may operate using two non-overlapping phases: PH1 and PH2, which cycle repeatedly. During PH1, the switches $SW_1$ and $SW_3$ are turned on, while during PH2, the switches $SW_2$ and $SW_4$ are turned on. The switches $SW_1$ and $SW_2$ function as a transmitter driver that charges the capacitor $C_M$ 582 during PH1 when $SW_1$ and $SW_3$ are turned on and discharges the capacitor $C_M$ 582 during PH2 when $SW_2$ and $SW_4$ are turned on.

The switches $SW_3$ and $SW_4$ function as current demodulation receiver switches. The analog buffer 588 keeps the receiver electrode potential approximately the same during both PH1 and PH2 operation phases, shielding the circuit 580 from the $C_{P1}$ 586 parasitic capacitance change. It should be noted that the integration capacitor $C_{INT}$ 590 is considered part of the capacitance sensing circuit 580 and is shown here for ease of explanation. During PH1, i.e., the charge cycle, the voltage potential for the capacitor $C_M$ 582 is $V_{CM}=V_{DD}-V_{CINT}$, the voltage potential for the parasitic capacitors $C_{P1}$ 586 and $C_{P2}$ 584 are $V_{CP1}=V_{CINT}$, $V_{CP2}=V_{DD}$. During PH2, i.e., the discharge cycle, the voltage potential for the capacitor $C_M$ 582 is $V_{CM}=V_{ABUF}=V_{CINT}=V_{CP1}$. The process of turning off and on the switches $SW_1$-$SW_4$ during PH1 and PH2 may be repeated sequentially for all of the sensor elements in the sensor array such as, for example, mutual capacitance sensor array 200. The amount of power dissipated across all of the capacitance sensors of mutual capacitance sensor array 200 during the sequential switching process is the switching power of the mutual capacitance sensor array.

Thus, in one embodiment, a capacitive sensor array is provided. The capacitive sensor array includes a plurality of column sensor elements arranged in a plurality of columns and a plurality of row sensor elements arranged in a plurality of rows. The plurality of rows and the plurality of columns are arranged such that each of the row sensor elements is at least partially within a gap between adjacent ones of the column sensor elements. A row-column capacitance between a first portion of one of the columns and an adjacent first portion of one of the rows is greater than a row-column capacitance between a second portion of one of the columns and an adjacent second portion of one of the rows.

In another embodiment, a mutual capacitance sensor array is provided. The mutual capacitance sensor array includes a plurality of transmitter electrodes arranged in a plurality of columns and a plurality of receiver electrodes arranged in a plurality of rows. The plurality of rows of receiver electrodes are arranged such that each of the plurality of receiver electrodes is at least partially within a space between adjacent ones of the plurality of transmitter electrodes. The plurality of transmitter electrodes and the plurality of receiver electrodes are configured such that a row-column capacitance between the plurality of transmitter electrodes and adjacent ones of the plurality of receiver electrodes varies across different regions of the mutual capacitance sensor array.

In a further embodiment, a method for operating a capacitive sensing device is provided. A capacitive sensor array is provided. The capacitive sensor array includes a plurality of column sensor elements arranged in a plurality of columns and a plurality of row sensor elements arranged in a plurality of rows. The plurality of rows overlap the plurality of columns such that each of the row sensor elements is at least partially within a gap between adjacent ones of the column sensor elements. A row-column capacitance between a first portion of one columns and an adjacent first portion of one of the rows is greater than a row-column capacitance between a second portion of one of the columns and an adjacent second portion of one of the rows. A change is detected in at least one of the row-column capacitance between the first portion of the one columns and the adjacent first portion of the one of the rows and the row-column capacitance between the second portion of the one of the columns and the adjacent second portion of the one of the rows. A proximity of an object to the capacitive sensing device is determined based on the detected change.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A capacitive sensor array, comprising:
    a plurality of first electrodes, each including at least two first sensor elements connected by at least one first interconnect, wherein each of the plurality of first electrodes is disposed along a first axis; and
    a plurality of second electrodes, each including at least two second sensor elements, wherein each of the plurality of second electrodes is disposed along a second axis, and wherein each of the at least two second sensor elements is at least partially disposed within a gap between two adjacent first sensor elements,
    wherein the plurality of first electrodes and the plurality of second electrodes only cross one another at intersections of the at least one first interconnect and the at least one second interconnect, and
    wherein a distance between the at least two second sensor elements and each of the two adjacent first sensor elements is variable and decreasing from the intersections.

2. The capacitive sensor array of claim 1 wherein the first plurality of electrodes and the second plurality of electrodes are substantially coplanar and electrically isolated from one another, and the first axis is substantially perpendicular to the second axis.

3. The capacitive sensor array of claim 1 wherein the distance between the at least two second sensor elements and each of the two adjacent first sensor elements is the largest adjacent to the intersections.

4. The capacitive sensor array of claim 1 wherein the at least one first interconnect is narrower than the at least two first sensor elements and the at least one second interconnect is narrower than the at least two second sensor elements.

5. The capacitive sensor array of claim 1, wherein the at least two first sensor elements and the at least two second sensor elements include a first shape, wherein the first shape is substantially a diamond shape including the at least one first or second interconnect disposed at two of its four corners.

6. The capacitive sensor array of claim 5, wherein at least one side edge of the diamond shape of the at least two first and second sensor elements is concave.

7. The capacitive sensor array of claim 1 is arranged in column and row electrodes, wherein the first plurality of electrodes is the column electrodes and the second plurality of electrodes is the row electrodes.

8. A capacitive sensor array, comprising:
row sensor elements arranged in a set of rows and column sensor elements arranged in a set of columns, wherein the set of rows and columns only intersect one another at at least one intersection which is positioned between the row and the column sensor elements, wherein each of the row sensor elements is located at least partially within a space between two adjacent column sensor elements, and wherein a distance measurement between at least one of the row sensors and its at least one of the two adjacent column sensor elements is varying such that the distance measurement is the largest adjacent to the at least one intersection.

9. The capacitive sensor array of claim 8, wherein each of the row sensor elements and the column sensor elements substantially include a diamond shape comprising four side edges.

10. The capacitive sensor array of claim 9, wherein the distance measurement includes a distance between corresponding side edges of the at least one of the row sensor elements and the at least one of the two adjacent column sensor elements that are closest to one another.

11. The capacitive sensor array of claim 9, wherein at least one side edge of at least one of the row and the column sensor elements includes a concave shape.

12. The capacitive sensor array of claim 9, wherein at least one side edge of at least one of the row and the column sensor elements includes a sawtooth shape.

13. A method, comprising:
providing a sensor array including
a set of column electrodes each including at least two column sensors connected by at least one column interconnect;
a set of row electrodes each including at least two row sensors connected by at least one row interconnect, wherein the set of column electrodes and the set of row electrodes are coupled to one another via mutual capacitance, and cross one another only at intersections of the at least one column and row interconnects;
providing the set of column electrodes and the row electrodes such that each row sensor is located between at least two adjacent column sensors, and vice versa; and
providing, in a first area of the sensor array, a distance between at least one row sensor and its corresponding the at least two adjacent column sensors such that the distance is variable and the largest adjacent to the intersections.

14. The method of claim 13, wherein the distance between the at least one row sensor and its corresponding the at least two adjacent column sensors is the largest adjacent to the intersections such that a mutual capacitance is the weakest thereabout.

15. The method of claim 13, wherein each of the row and the column sensors includes substantially a diamond shape comprising four side edges.

16. The method of claim 15, further comprising:
providing, in a second area of the sensor array, at least one of the side edges of at least one row sensor in a concave shape to reduce the mutual capacitance between the at least one row sensor and its corresponding the at least two adjacent column sensors.

17. The method of claim 16, wherein the second area is physically close to an interface connecting the sensor array to a capacitance sensor circuit.

18. The method of claim 15, further comprising:
providing, in a third area of the sensor array, at least one of the side edges of at least one row sensor into a sawtooth shape to increase the mutual capacitance between the at least one row sensor and its corresponding the at least two adjacent column sensors.

19. The method of claim 18, wherein the third area is physically adjacent to a perimeter of the sensor array.

20. The method of claim 13, wherein the set of row electrodes and the set of column electrodes are interchangeable.

21. The method claim 13, wherein the first area, the second area and the third area are at least partially overlapping one another.

* * * * *